US010784870B2

(12) United States Patent
Makimoto

(10) Patent No.: US 10,784,870 B2
(45) Date of Patent: Sep. 22, 2020

(54) ELECTRONIC CIRCUIT, SEMICONDUCTOR INTEGRATED CIRCUIT AND MONITORING CIRCUIT MOUNTED WITH THE SAME, AND ELECTRONIC DEVICE

(71) Applicant: Rohm Co., Ltd., Kyoto (JP)

(72) Inventor: Hiroyuki Makimoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/738,228

(22) Filed: Jan. 9, 2020

(65) Prior Publication Data

US 2020/0145010 A1    May 7, 2020

Related U.S. Application Data

(63) Continuation of application No. 16/365,207, filed on Mar. 26, 2019, now Pat. No. 10,554,208.

(30) Foreign Application Priority Data

Mar. 29, 2018    (JP) ................................. 2018-063959

(51) Int. Cl.
    *H03K 21/02*    (2006.01)
    *H03K 3/037*    (2006.01)
    *G01R 19/25*    (2006.01)
(52) U.S. Cl.
    CPC ......... *H03K 21/02* (2013.01); *G01R 19/2513* (2013.01); *H03K 3/037* (2013.01)

(58) Field of Classification Search
    None
    See application file for complete search history.

(56) References Cited

U.S. PATENT DOCUMENTS

| 8,884,673 B1 | 11/2014 | Shao |
| 10,147,678 B2 * | 12/2018 | Iwamoto ................ G11C 19/28 |
| 2014/0111259 A1 | 4/2014 | Lin |

FOREIGN PATENT DOCUMENTS

| JP | 2017-010297 | 1/2017 |
| JP | 2017-108114 | 6/2017 |

* cited by examiner

*Primary Examiner* — Jeffery S Zweizig
(74) *Attorney, Agent, or Firm* — Fish & Richardson P.C.

(57) ABSTRACT

An electronic circuit is configured to output an output signal after elapse of a predetermined time from a received trigger signal, and includes an oscillator configured to output a pulse signal having a predetermined oscillation frequency; a counter circuit configured to count the pulse signal from the oscillator upon receiving the trigger signal and to output the output signal in response to a count value reaching a predetermined value; and a trimming circuit including a plurality of trimming elements which includes a cuttable conductive part and configured to output a selection signal corresponding to a trimming element having a cut conductive part. In the trimming circuit, the trimming element, which corresponds to the oscillation frequency of the pulse signal output from the oscillator among the plurality of trimming elements, is cut, and the counter circuit is configured to set the predetermined value according to the selection signal.

16 Claims, 11 Drawing Sheets

FIG. 8

| Fuse cut | POSCEN | PGATE | MP20 | MP21 | MN10 | SEL |
|---|---|---|---|---|---|---|
| Yes | L | H | OFF | OFF | ON | L |
| | H | Active | ON | ON | OFF | H |
| No | L | H | OFF | OFF | ON | L |
| | H | Active | ON | ON | OFF | L |

ELECTRONIC CIRCUIT, SEMICONDUCTOR INTEGRATED CIRCUIT AND MONITORING CIRCUIT MOUNTED WITH THE SAME, AND ELECTRONIC DEVICE

CROSS-REFERENCE TO RELATED APPLICATION(S)

This application is a continuation of U.S. patent application Ser. No. 16/365,207, filed Mar. 26, 2019, which claims the benefit of priority from Japanese Patent Application No. 2018-063959, filed on Mar. 29, 2018, the entire contents of which are incorporated herein by reference.

TECHNICAL FIELD

The present disclosure relates to an electronic circuit, a semiconductor integrated circuit and a monitoring circuit mounted with the same, and an electronic device, and more specifically, to a technique for improving the accuracy of a timer circuit that measures a predetermined time.

BACKGROUND

In electronic devices, a timer circuit that measures a predetermined time is often used to control the operation timing of each function. Such a timer circuit is also used, for example, for power supply monitoring and abnormality detection of the electronic devices, but if a deviation occurs in measurement time, it may be a factor of erroneous detection such as abnormality. Therefore, it is necessary to measure the time with high accuracy in such a timer circuit.

Generally, the timer circuit measures a predetermined time by counting, by a counter circuit, the number of clocks (pulses) of a reference clock signal generated by an oscillator. In the oscillator, a CR oscillation circuit that oscillates according to a time constant of capacitors and resistors is used to generate the reference clock signal. However, an oscillation frequency may vary according to temperature characteristics or manufacturing variations of semiconductor elements or the like included in the oscillation circuit. When the oscillation frequency (i.e., the reference clock signal) of the oscillator varies, the time measured by the timer circuit varies as a result.

A related art discloses a clock signal generation circuit including an oscillator circuit (a first oscillation circuit) using an oscillator and a CR oscillation circuit (a second oscillation circuit) where a configuration in which an oscillation frequency of the second oscillation circuit is adjusted by switching values of capacitors and/or resistors of the second oscillation circuit by a trimming circuit based on an oscillation frequency of the first oscillation circuit temperature-compensated by using a detection value of a temperature sensor. In the configuration of the related art, the adjustment of a resonance frequency of the second oscillation circuit is performed, for example, when a power supply voltage varies more than a predetermined value. Thus, with the configuration of the related art, it is possible to realize a highly accurate oscillation frequency even when the temperature and the power supply voltage vary.

Further, another related art discloses a trimming device for correcting a deviation in electrical characteristics of semiconductor devices. In the trimming device of the related art, a bit value for a device to be trimmed is set by cutting a fuse depending on an amount of deviation of the electric characteristics to be corrected, and the electrical characteristics are corrected in the device to be trimmed depending on the bit value.

Conventionally, a technique for adjusting an oscillation frequency of an oscillator using a trimming circuit for cutting a conductive part such as a fuse is known. As described above, in the oscillator, the oscillation frequency may deviate from a desired value due to temperature and manufacturing variations.

In the oscillator having the trimming circuit described above, the oscillation frequency may be adjusted by adjusting the values of capacitors or resistors in the oscillator. When adjusting all the influences of temperature characteristics and manufacturing variations with the oscillator, it is necessary to prepare a large number of capacitors and resistors to be used for adjustment according to a desired adjustment range.

In addition, in a case where such a circuit is formed by an integrated circuit (IC), since the capacitors and the resistors for adjustment are larger in size than other logic circuits, when a large number of capacitors and resistors for adjustment are prepared, the chip area of the IC becomes large, which is a factor hindering miniaturization.

SUMMARY

Some embodiments of the present disclosure provide improvement in measurement accuracy of time while preventing an increase in circuit area, in an electronic circuit including a timer circuit that measures a predetermined time.

According to one or more embodiments of the present disclosure, there is provided an electronic circuit configured to output an output signal after elapse of a predetermined time from a received trigger signal. The electronic circuit includes an oscillator, counter circuit, and a trimming circuit. The oscillator is configured to output a pulse signal having a predetermined oscillation frequency. The counter circuit is configured to count the pulse signal from the oscillator upon receiving the trigger signal and to output the output signal in response to a count value reaching a predetermined value. The trimming circuit includes a plurality of trimming elements which includes a cuttable conductive part and is configured to output a selection signal corresponding to a trimming element having a cut conductive part. In the trimming circuit, the trimming element, which corresponds to the oscillation frequency of the pulse signal output from the oscillator among the plurality of trimming elements, is cut. The counter circuit is configured to set the predetermined value according to the selection signal.

Preferably, the oscillator is configured to start outputting the pulse signal in response to the trigger signal and to stop outputting the pulse signal according to the output of the output signal from the counter circuit.

Preferably, the trimming circuit is configured to output the selection signal only while the pulse signal is output from the oscillator.

Preferably, the trimming circuit includes a plurality of switching parts corresponding to the plurality of trimming elements, respectively. Each of the plurality of switching parts includes: a first switch including a first end connected to a power supply voltage and a second end connected to a reference potential via a corresponding trimming element; a second switch connected in parallel to the corresponding trimming element; and an output terminal connected between the first switch and the second switch and configured to output the selection signal. The first switch becomes conductive during oscillation of the oscillator. The second switch becomes non-conductive in response to receiving the trigger signal. The selection signal is output from a switching part including the trimming element, which has the cut conductive part, among the plurality of switching parts.

Preferably, the counter circuit includes a plurality of flip-flop circuits and a selection part. The plurality of flip-flop circuits is connected in series and configured to count the pulse signal from the oscillator. The selection part is configured to set the predetermined value corresponding to the selection signal and to output the output signal in response to an output corresponding to the predetermined value, among outputs of the plurality of flip-flop circuits.

Preferably, the counter circuit is configured to start operation of the plurality of flip-flop circuits in response to the trigger signal.

According to other embodiments of the present disclosure, there is provided a monitoring circuit for monitoring a power supply voltage supplied to a target device. The monitoring circuit includes the electronic circuit of one of the embodiments as described above; a comparison part; and a signal output part. The comparison part is configured to output the trigger signal in response to the power supply voltage exceeding a predetermined reference voltage. The signal output part is configured to output a start-up permission signal to the target device in response to the output signal from the electronic circuit.

According to still other embodiments of the present disclosure, there is provided a semiconductor integrated circuit in which the electronic circuit of one of the embodiments as described above is integrated.

Preferably, in a package of the semiconductor integrated circuit, the counter circuit is arranged adjacent to the oscillator, and the trimming circuit is arranged adjacent to the counter circuit.

According to still other embodiments of the present disclosure, there is provided an electronic device on which the electronic circuit of one of the embodiments as described above is mounted.

BRIEF DESCRIPTION OF DRAWINGS

FIG. 8 is a diagram illustrating a state of the trimming circuit and a selection signal to be output.

DETAILED DESCRIPTION

Figure 1:
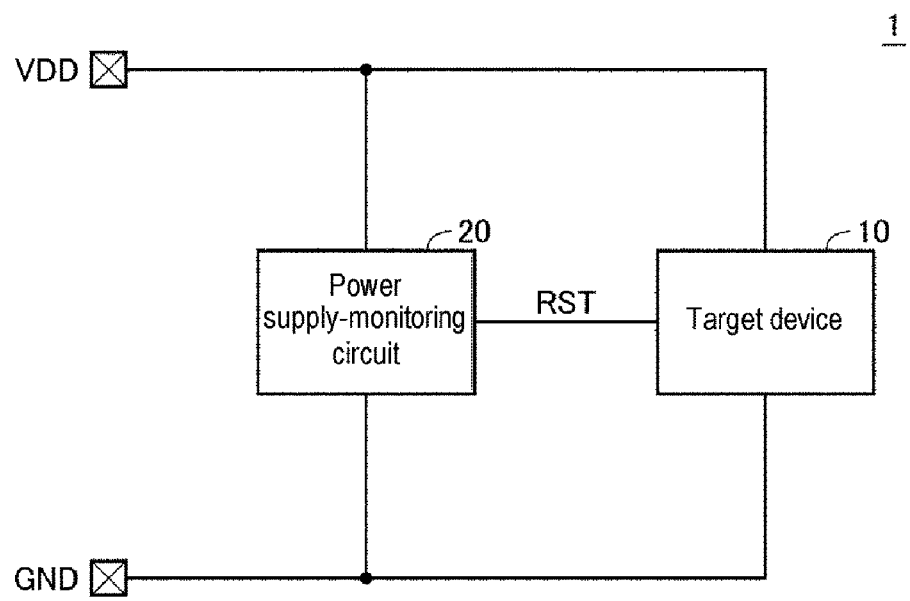
FIG. 1 is a schematic block diagram of an electronic device mounted with an electronic circuit (timer circuit) according to embodiments of the present disclosure.

Embodiments of the present disclosure will be now described in detail with reference to the drawings. Further, like or equivalent parts in the drawings are given like reference numerals and a repeated description thereof will be omitted.

[Overall Configuration of Electronic Device]

FIG. 1 is a schematic block diagram of an electronic device 1 mounted with an electronic circuit (timer circuit) according to embodiments of the present disclosure. Referring to FIG. 1, the electronic device 1 includes a target device 10 to which a power supply voltage VDD is supplied, and a power supply-monitoring circuit 20 that monitors a power supply of the target device 10.

The target device 10 is, for example, a control device configured to comprehensively control the electronic device 1 or a device that operates independently in the electronic device 1 or in cooperation with other devices. The target device 10 is connected to the power supply voltage VDD and a reference potential GND, and operates using electric power supplied from the power supply voltage VDD.

The power supply-monitoring circuit 20 is connected to the power supply voltage VDD and the reference potential GND, and monitors whether or not the power supply voltage VDD is within an operable voltage range of the target device 10. An output of the power supply-monitoring circuit 20 is connected to a reset terminal of the target device 10, and the start-up and stop of the target device 10 are controlled according to a state of a reset signal RST transmitted from the power supply-monitoring circuit 20. Specifically, when the power supply voltage VDD is within the operable voltage range of the target device 10, the reset signal RST is set to "Hi (H)," and when the power supply voltage VDD is out of the operable voltage range, the reset signal RST is set to "Lo (L)."

The target device 10 is started up when the reset signal RST is "H," and is stopped (system reset) when the reset signal RST is "L." That is, the reset signal RST functions as a start-up permission signal for the target device 10.

Figure 2:
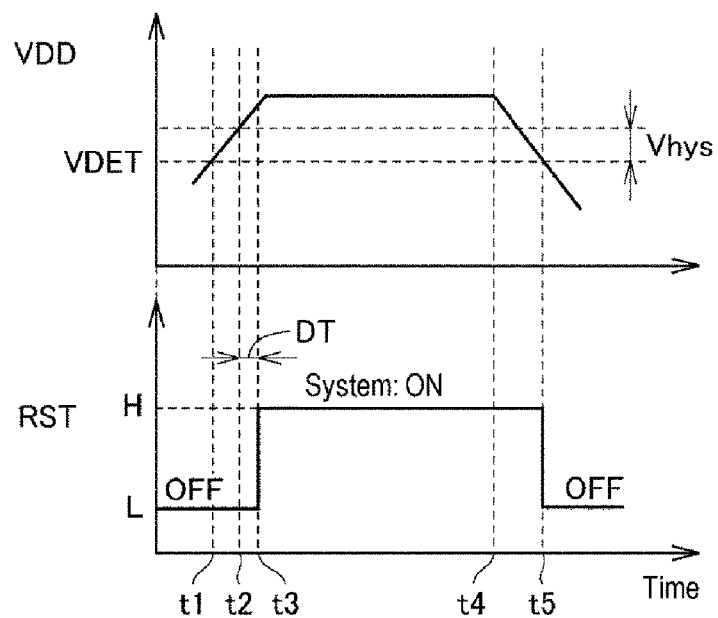
FIG. 2 is a diagram illustrating a function of a power supply-monitoring circuit in FIG. 1.

FIG. 2 is a diagram illustrating a relationship between states of the power supply voltage VDD and the reset signal RST. In FIG. 2, the horizontal axis indicates time and the vertical axis indicates states of the power supply voltage VDD (upper stage) and the reset signal RST (lower stage).

The target device 10 has hysteresis in a start-up voltage and a stopping voltage so that the start-up and stop are not frequently repeated at a voltage near a lower limit voltage VDET of the operable voltage range. Specifically, the target device 10 is started up when the power supply voltage VDD exceeds a voltage higher than the lower limit voltage VDET, which is equal to the lower limit value of the operable voltage range of the target device 10, by a hysteresis voltage Vhys, and is stopped when the power supply voltage VDD is lower the lower limit voltage VDET.

Referring to FIG. 2, the output (reset signal RST) of the power supply-monitoring circuit 20 before the power supply of the electronic device is supplied is in an "L" state. When the power supply of the electronic device 1 is supplied, the power supply voltage VDD gradually rises with time. However, due to the hysteresis described above, the start-up condition is not established and the reset signal RST remains "L" at time t1 when the power supply voltage VDD reaches the lower limit voltage VDET.

When the power supply voltage VDD further rises and reaches the lower limit voltage VDET plus the hysteresis voltage Vhys (at time t2), the start-up condition of the target device 10 is established. In the power supply-monitoring circuit 20, in order to secure the establishment state of a stable start-up condition, the reset signal RST is switched to "H" at time t3 after a predetermined delay time DT (e.g., 50 to 100 msec) from time t2 at which the start-up condition is established. Thus, the target device 10 is started up.

Thereafter, when the stop operation of the target device 10 is performed, the power supply voltage VDD starts to drop accordingly (time t4). Then, when the power supply voltage VDD drops to the lower limit voltage VDET (time t5), the reset signal RST is switched to "L" by the power supply-monitoring circuit 20, whereby the target device 10 is stopped.

At this time, if there is a deviation in a measurement value of the delay time DT in the power supply-monitoring circuit 20, the target device 10 may be started up early even though the power supply voltage VDD is still unstable, or conversely, the start-up of the target device 10 may be unnecessarily delayed. Therefore, it is necessary to accurately measure the delay time DT in the power supply-monitoring circuit 20.

[Description of Power Supply-Monitoring Circuit]

Figure 3:
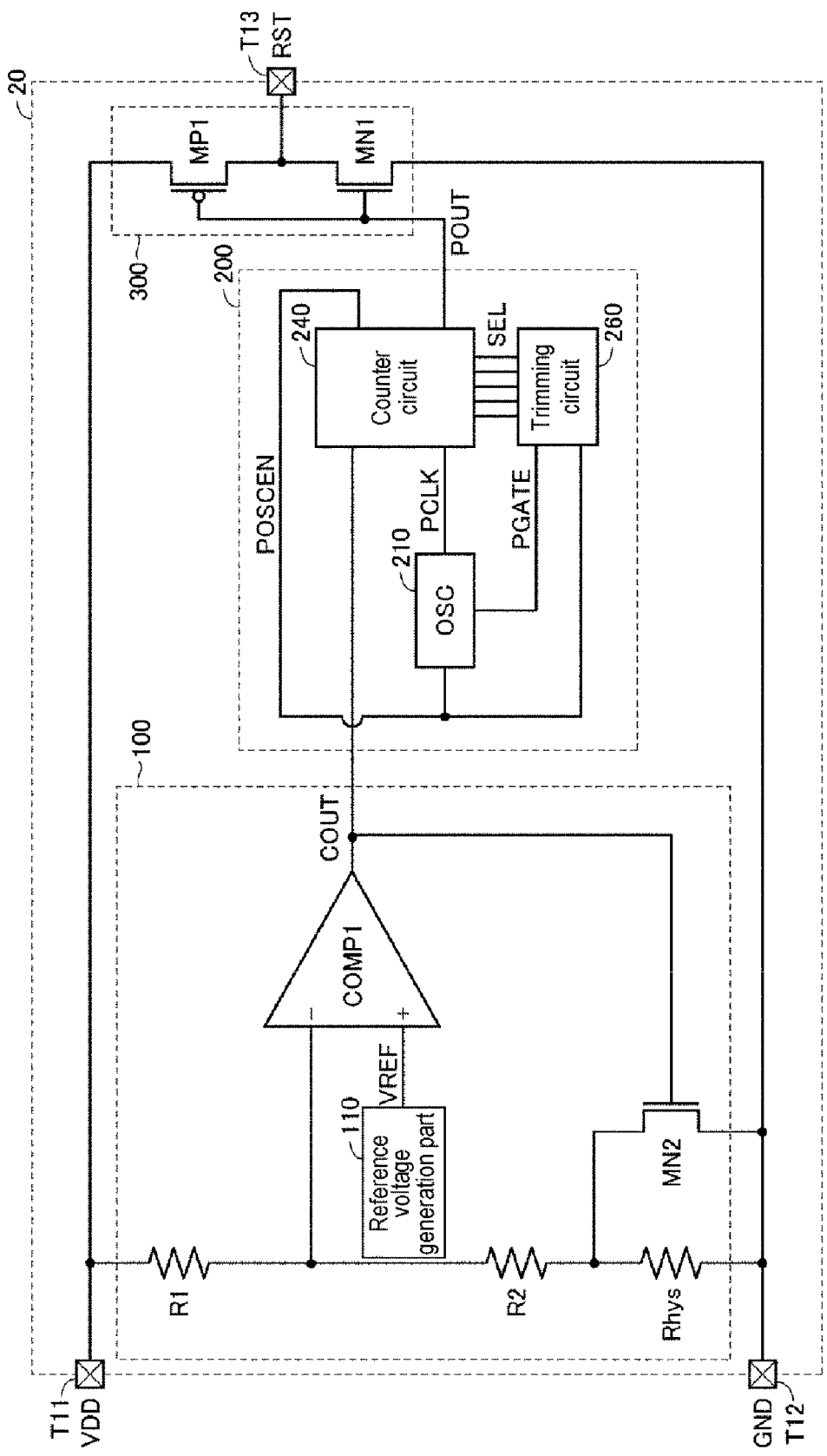
FIG. 3 is a functional block diagram of the power supply-monitoring circuit in FIG. 1.

FIG. 3 is a diagram illustrating details of the power supply-monitoring circuit 20. The power supply-monitoring circuit 20 includes a comparison part 100, a timer circuit 200, and a signal output part 300.

(Comparison Part)

The comparison part 100 is a circuit for determining that the power supply voltage VDD exceeds a predetermined reference voltage. The comparison part 100 includes a reference voltage generation part 110, a comparator COMP1, resistors R1, R2 and Rhys, and a switch MN2.

The resistors R1, R2 and Rhys are connected in series between a terminal T11 that receives the power supply voltage VDD and a terminal T12 that receives a reference potential GND. More specifically, one end of the resistor R1 is connected to the terminal T11, and the other end thereof is connected to one end of the resistor R2. The other end of the resistor R2 is connected to one end of the resistor Rhys, and the other end of the resistor Rhys is connected to the terminal T12.

An inverting input of the comparator COMP1 is connected to a connection node of the resistor R1 and the resistor R2. A voltage divided by the resistors R1, R2 and Rhys is input to the inverting input of the comparator COMP1. In the meantime, a reference voltage VREF from the reference voltage generation part 110 is input to a non-inverting input of the comparator COMP1. The reference voltage generation part 110 is, for example, a voltage source that outputs the predetermined reference voltage VREF.

The comparator COMP1 outputs an "H" output signal COUT when the voltage to the inverting input is lower than the reference voltage VREF, and outputs an "L" output signal COUT when the voltage to the inverting input is higher than the reference voltage VREF.

The switch MN2 is typically an N-type metal oxide semiconductor field effect transistor (MOSFET). The switch MN2 is connected in parallel to the resistor Rhys, in which a control terminal (gate) of the switch MN2 is connected to the output of the comparator COMP1.

When the power supply voltage VDD is not supplied to the terminal T11, the voltage input to the inverting input of the comparator COMP1 becomes lower than the reference voltage VREF, the output of the comparator COMP1 becomes "H," and the switch MN2 becomes conductive (ON). Thus, the resistor Rhys is bypassed. In this state, when the power supply voltage VDD rises, a voltage divided by the resistor R1 and the resistor R2 is input to the inverting input of the comparator COMP1.

When the voltage divided by the resistor R1 and the resistor R2 becomes higher than the reference voltage VREF, the output of the comparator COMP1 becomes "L," and the switch MN2 becomes non-conductive (OFF). Thus, a voltage divided by the resistor R1 and a combined resistance of the resistors R2 and Rhys is input to the inverting input of the comparator COMP1. As the resistor Rhys is added, the voltage input to the inverting input of the comparator COMP1 becomes higher than when the switch MN2 is turned on. Therefore, the power supply voltage VDD when the output of the comparator COMP1 changes from "L" to "H" becomes substantially lower than the power supply voltage VDD when the output of the comparator COMP1 changes from "H" to "L."

That is, it is possible to realize the hysteresis at the start-up and stop as described above with reference to FIG. 2 by appropriately setting the resistance values of the resistors R1, R2, and Rhys.

(Timer Circuit)

The timer circuit 200 is a circuit for delaying the output signal COUT of the comparison part 100. When the output signal COUT is switched from "H" to "L," the timer circuit 200 delays an output signal POUT by a predetermined time and outputs it to the signal output part 300.

The timer circuit 200 includes an oscillator (OSC) 210, a counter circuit 240, and a trimming circuit 260. Details of the oscillator 210, the counter circuit 240, and the trimming circuit 260 will be described below with reference to FIGS. 5 to 7, but roughly, the counter circuit 240 counts the number of pulses of a pulse signal PCLK output from the oscillator 210 and measures a predetermined time by detecting the count value reaching a predetermined value. The counter circuit 240 outputs the output signal POUT when the count value reaches the predetermined value. At this time, the counter circuit 240 sets the predetermined value depending on a selection signal SEL from the trimming circuit 260.

The trimming circuit 260 includes a plurality of trimming elements having a cuttable conductive part such as, e.g., a fuse. Each of the trimming elements is connected to a corresponding adjustment element in a circuit to be adjusted (here, the counter circuit 240). The trimming circuit 260 outputs, as "H," the selection signal SEL which is determined by a trimming element in which the conductive part is cut among the plurality of trimming elements. In the circuit to be adjusted, the corresponding adjustment element is selected depending on the selection signal SEL.

(Signal Output Part)

The signal output part 300 includes switches MP1 and MN1 connected in series between the terminal T11 and the terminal T12. The switch MP1 is a P-type MOSFET and the switch MN1 is an N-type MOSFET. A source of the switch MP1 is connected to the terminal T11 and a drain of the switch MP1 is connected to a drain of the switch MN1. A source of switch MN1 is connected to the terminal T12.

A connection node between the switch MP1 and the switch MN1 is connected to a terminal T13. The terminal T13 is connected to the target device 10 in FIG. 1 and the reset signal RST is output from the terminal T13.

A gate of the switch MP1 and a gate of the switch MN1 are both connected to the output of the timer circuit 200. When the output signal POUT of the timer circuit 200 is "H," the switch MP1 becomes non-conductive and the switch MN1 becomes conductive. Thus, the reset signal RST becomes "L." On the other hand, when the output signal POUT of the timer circuit 200 is "L," the switch MP1 becomes conductive and the switch MN1 becomes non-conductive. Thus, the reset signal RST becomes "H."

That is, when the power supply voltage VDD rises to a predetermined voltage (VDET+Vhys) including hysteresis, the output signal COUT of the comparison part 100 becomes "L," and after an elapse of a predetermined time, the output signal POUT of the timer circuit 200 becomes "L," whereby the reset signal RST of the signal output part 300 becomes "H." Thus, the target device 10 is started up.

Further, when the power supply voltage VDD drops to the voltage VDET, the output signal COUT of the comparison part 100 becomes "H," and the output signal POUT of the timer circuit 200 becomes "H" accordingly, whereby the reset signal RST becomes "L." Thus, the target device 10 is stopped.

(Description of Comparative Example)

Figure 4:
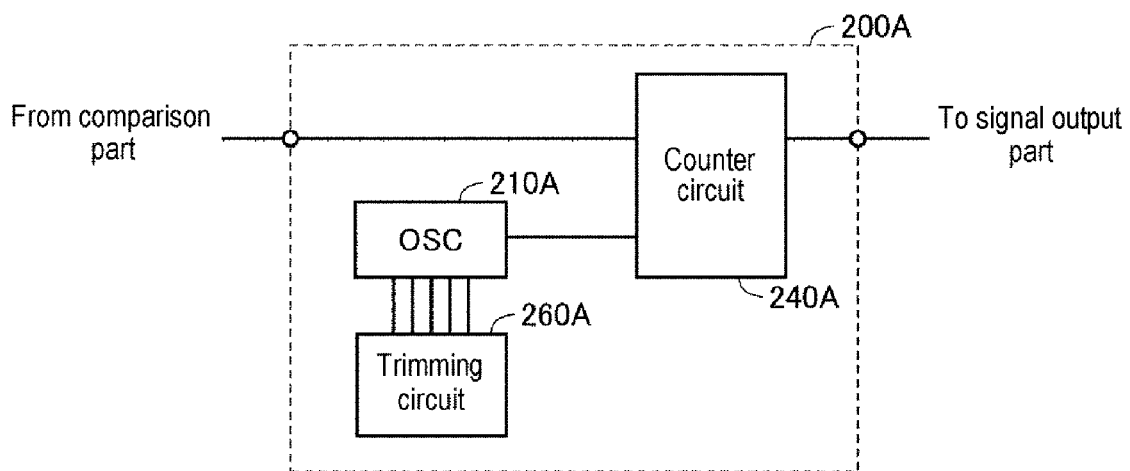
FIG. 4 is a functional block diagram of a timer circuit according to a comparative example.

FIG. 4 is a functional block diagram of a timer circuit 200A according to a comparative example. Referring to FIG. 4, similar to the timer circuit 200 in FIG. 3, the timer circuit 200A includes an oscillator 210A, a counter circuit 240A, and a trimming circuit 260A. However, in the timer circuit 200A according to the comparative example, the trimming circuit 260A is connected to the oscillator 210A and adjusts an oscillation frequency of a pulse signal output from the oscillator 210. The counter circuit 240A counts the pulse signal output from the oscillator 210A and measures a predetermined time by detecting that the count value reaches a predetermined value. In the comparative example, since the predetermined value in the counter circuit 240A is a fixed value, it is necessary to improve the accuracy of the oscillation frequency output from the oscillator 210A in order to improve the measurement accuracy of the timer circuit 200A.

Generally, in oscillators, the oscillation frequency may vary slightly by the individual oscillators according to manufacturing variations or temperature characteristics of semiconductor elements such as MOSFETs installed in the oscillators. The adjustment of the oscillation frequency in the oscillator is performed by adjusting values of capacitors or resistors in the oscillator. Therefore, when adjusting all the influences of temperature characteristics and manufacturing variations by the oscillator as in the comparative example, it is necessary to prepare a large number of capacitors and resistors to be used for adjustment.

In the case where the timer circuit in FIG. 3 or 4 is formed by an IC, since these capacitors and the resistors for adjustment are larger in size than other logic circuits, when a large number of capacitors and resistors are installed, the area of the IC chip becomes large, which may be a factor hindering miniaturization of the entire circuit.

The timer circuit 200 according to the present embodiments uses a method which determines the oscillation frequency using fixed capacitors and resistors for the oscillator 210, and adjusts a deviation from the design value of the oscillation frequency due to the manufacturing variations or the like by changing the predetermined value of the count value in the counter circuit 240 for such deviation. More specifically, in the case of measuring the time of, for example, 1 msec, when the oscillation frequency from the oscillator 210 is 100 kHz, the predetermined value of the count value in the counter circuit 240 is set to become 100, and when the oscillation frequency is 200 kHz, the predetermined value of the count value is set to become 200.

In the configuration of the present embodiments, since it is not necessary to install a large number of capacitors or resistors for adjusting the oscillation frequency in the IC chip, it is possible to prevent an increase in circuit area of the IC chip.

[Configuration of Timer Circuit]
(Oscillator)

Figure 5:
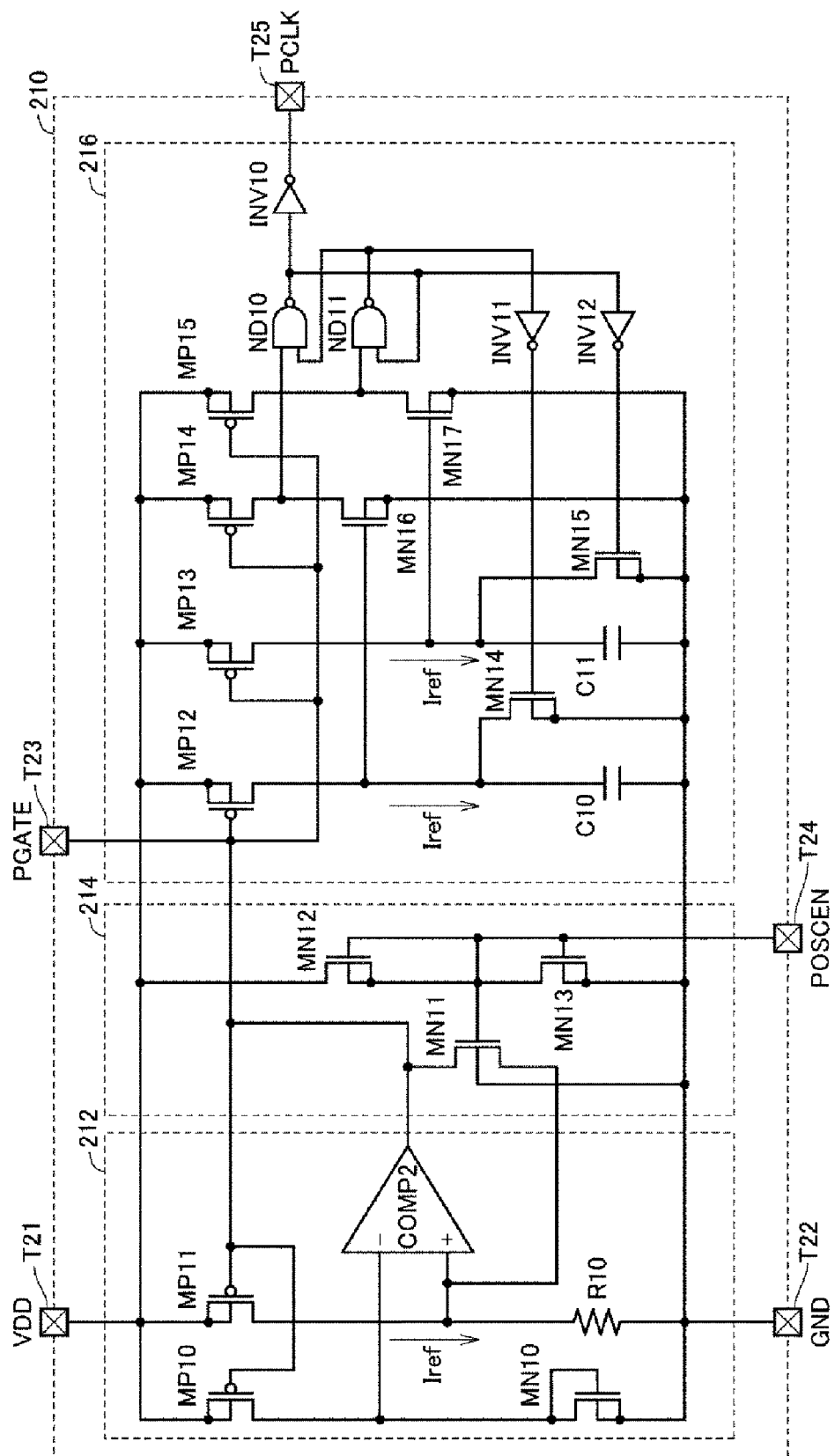
FIG. 5 is a diagram illustrating a detailed circuit of an oscillator.

FIG. 5 is a diagram illustrating a detailed circuit of the oscillator 210 in the timer circuit 200 in FIG. 3. Referring to FIG. 5, the oscillator 210 includes a reference current generation part 212, a start-up circuit part 214, and an oscillation signal generation part 216.

The reference current generation part 212 includes switches MP10, MP11, and MN10, a comparator COMP2, and a resistor R10. The switches MP10 and MP11 are P-type MOSFETs, and the switch MN10 is an N-type MOSFET.

A source of the switch MP10 is connected to a terminal T21 to which the power supply voltage VDD is supplied, and a drain of the switch MP10 is connected to a drain of the switch MN10. A source of the switch MN10 is connected to a terminal T22 connected to the reference potential GND. A gate of the switch MN10 is connected to the drain of the switch MN10. Thus, the switch MN10 becomes conductive when the power supply voltage VDD reaches a threshold voltage Vthn of the switch MN10.

A source of the switch MP11 is connected to the terminal T21 to which the power supply voltage VDD is supplied, and a drain of the switch MP11 is connected to the terminal T22 via the resistor R10. A gate of the switch MP11 is connected to a gate of the switch MP10. That is, the switch MP10 and the switch MP11 form a mirror circuit. Thus, current of the same magnitude flows through the switch MP10 and the switch MP11.

An inverting input of comparator COMP2 is connected to a connection node between the switch MP10 and the switch MN10. Further, a non-inverting input of the comparator COMP2 is connected to a connection node between the switch MP11 and the resistor R10. An output of the comparator COMP2 is connected to the gates of the switch MP10 and the switch MP11.

The start-up circuit part 214 is a circuit that starts up the oscillator 210 in response to an external trigger signal. The start-up circuit part 214 includes switches MN11 to MN13 which are N-type MOSFETs.

The switch MN12 and the switch MN13 are connected in series between the terminal T21 and the terminal T22. A drain of the switch MN12 is connected to the terminal T21, a source of the switch MN12 is connected to a drain of the switch MN13, and a source of the switch MN13 is connected to the terminal T22. Gates of the switches MN12 and MN13 are all connected to a terminal T24 and also connected to a gate of the switch MN11 via a connection node between the switch MN12 and the switch MN13.

A source of the switch MN11 is connected to the non-inverting input of the comparator COMP2, and a drain of the switch MN11 is connected to the output of the comparator COMP2. Further, a base of the switch MN11 is connected to the terminal T22.

Figure 7:
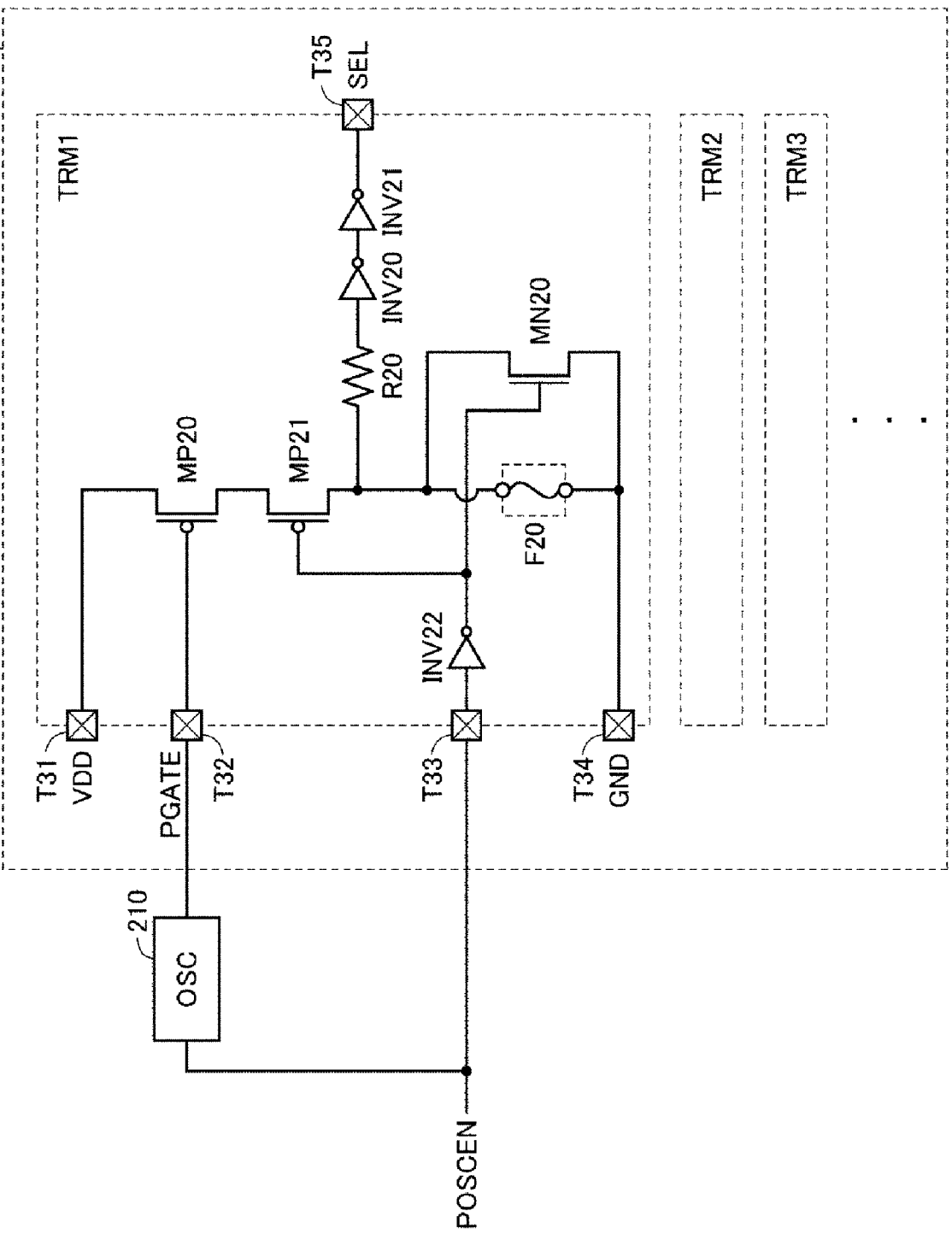
FIG. 7 is a diagram illustrating details of a trimming circuit.

An enable signal POSCEN for the oscillator generated by the counter circuit 240, which will be described below with reference to FIG. 7, is input as a trigger signal to the terminal T24.

The oscillation signal generation part 216 includes switches MP12 to MP15 which are P-type MOSFETs, switches MN14 to MN17 which are N-type MOSFETs, NAND circuits ND10 and ND11, inverters INV10 to INV12, and capacitors C10 and C11. The capacitors C10 and C11 have the same capacitance.

A source of the switch MP12 is connected to the terminal T21, and a drain of the switch MP12 is connected to the terminal T22 via the capacitor C10. The switch MN14 is connected in parallel to the capacitor C10. A source of the switch MP13 is connected to the terminal T21, and a drain of the switch MP13 is connected to the terminal T22 via the capacitor C11. The switch MN15 is connected in parallel to the capacitor C11.

A source of the switch MP14 is connected to the terminal T21, and a drain of the switch MP14 is connected to a drain of the switch MN16. A source of the switch MN16 is connected to the terminal T22, and a gate of the switch MN16 is connected to the drain of the switch MP12. A source of the switch MP15 is connected to the terminal T21, and a drain of the switch MP15 is connected to a drain of the switch MN17. A source of the switch MN17 is connected to the terminal T22, and a gate of the switch MN17 is connected to the drain of the switch MP13.

The gates of the switches MP12 to MP15 are all connected to the gates of the switches MP10 and MP11 and a terminal T23. That is, the switches MP12 to MP15 form a mirror circuit with the switches MP10 and MP11. A signal input from the terminal T23 to the gates of the switches MP10 to MP15 is output as a signal PGATE to the trimming circuit 260, which will be described below with reference to FIG. 6.

One input of the NAND circuit ND10 is connected to the drain of the switch MN14, and the other input thereof is connected to the gate of the switch MN14 via the inverter INV11. An output of the NAND circuit ND10 is connected to a terminal T25 via the inverter INV10.

One input of the NAND circuit ND11 is connected to the drain of the switch MN15 and the other input thereof is connected to the gate of the switch MN15 via the inverter INV12 and is also connected to the output of the NAND circuit ND10. An output of the NAND circuit ND11 is connected to the other input of the NAND circuit ND10. That is, the NAND circuits ND10 and ND11 form a flip-flop circuit.

Next, an operation of the oscillator 210 will be described. The oscillator 210 is started up with the enable signal POSCEN input to the terminal T24 as a trigger. When the enable signal POSCEN is in an initial state of "L," the switches MN11 to MN13 are non-conductive, the gates of the switches MP10 to MP15 become "H," and the switches MP10 to MP15 become non-conductive. In this state, the oscillator 210 is stopped, and the signal PCLK output from the terminal T25 becomes "L."

When the enable signal POSCEN becomes "H," the switches MN12 and MN13 become conductive, and the switch MN11 becomes also conductive. Therefore, the output and the non-inverting input of the comparator COMP2 are short-circuited, and the potential of the gates of the switches MP10 to MP15 is lowered. Thus, the switches MP10 to MP15 become conductive.

In the reference current generation part 212, when the switch MP10 becomes conductive, the power supply voltage VDD is applied to the switch MN10. Since the gate of the switch MN10 is connected to its drain and the output of the comparator COMP2 is virtually short-circuited to its non-inverting input, the potential on the non-inverting input side of the comparator COMP2 is maintained at the threshold voltage Vthn of the switch MN10 as a resultant. Accordingly, assuming that the resistance of the resistor R10 is R, a current Iref as indicated in equation (1) flows through the resistor R10.

$$Iref=Vthn/R \qquad \text{Eq. (1)}$$

Therefore, the same current flows through the switches MP12 to MP15 serving as the mirror circuit. Further, at this time, the potential (=the signal PGATE) of the gates of the switches MP10 to MP15 also becomes the threshold voltage Vthn of the switch MN10.

In the oscillation signal generation part 216, in the initial state where the enable signal POSCEN is "L," the outputs of the NAND circuits ND10 and ND11 are "H," and the switches MN14 and MN15 become both non-conductive.

When the enable signal POSCEN becomes "H" and the switches MP10 to MP15 become conductive and the current Iref flows as described above, the output of the NAND circuit ND10 becomes "L," the switch MN15 becomes conductive, and the capacitor C11 is bypassed. Further, the output of the NAND circuit ND11 remains "H." The switch MN14 becomes non-conductive and the capacitor C10 is charged by the current Iref. At this time, the signal PCLK output from the terminal T25 becomes "H."

When the capacitor C10 is charged and the potential between the switch MP12 and the capacitor C10 becomes "H," the switch MN16 becomes conductive and the output of the NAND circuit ND10 becomes "H." Thus, the output of the NAND circuit ND11 becomes "L," the switch MN14 becomes conductive, and the capacitor C10 is discharged. On the other hand, as the switch MN15 becomes non-conductive, the capacitor C11 starts to be charged. At this time, the signal PCLK output from the terminal T25 becomes "L."

When the capacitor C10 is discharged and the potential between the switch MP12 and the capacitor C10 becomes "L," the switch MN16 becomes non-conductive. In addition, when the capacitor C11 is charged and the potential between the switch MP13 and the capacitor C11 becomes "H," the switch MN17 becomes conductive. Thus, the output of the NAND circuit ND10 becomes "L," the switch MN14 becomes conductive, and the capacitor C10 again starts to be charged. On the other hand, the output of the NAND circuit ND11 becomes "H," and the switch MN15 becomes non-conductive, whereby the capacitor C11 is discharged. At this time, the signal PCLK output from the terminal T25 becomes "H."

Thus, when the enable signal POSCEN becomes "H" and the oscillator 210 is started up, the capacitor C10 and the capacitor C11 are alternately and repeatedly charged and discharged so that the pulse signal PCLK having a predetermined oscillation frequency determined according to the charging time of the capacitors C10 and C11 is output from the terminal T25.

At this time, the voltage applied to the capacitors C10 and C11 by the mirror circuit is equal to the threshold voltage Vthn of the switch MN10, and the current flowing therethrough becomes Iref. Here, assuming that the capacitance of the capacitors C10 and C11 is C, the electric charge is Q, and the charging time is t, the charging time t is given by equation (4) below from the general relationship of the following equations (2) and (3) and Eq. (1) set forth above.

$$Q=C \cdot Vthn \qquad \text{Eq. (2)}$$

$$Q=Iref \cdot t \qquad \text{Eq. (3)}$$

$$t=C \cdot Vthn/Iref=C \cdot R \qquad \text{Eq. (4)}$$

That is, an oscillation frequency f of the pulse signal output from the oscillator 210 is as indicated in equation (5), and is determined only by the resistance value of the resistor R10 and the capacitance of the capacitors C10 and C11.

$$f = \tfrac{1}{2}CR \qquad \text{Eq. (5)}$$

In general, since a semiconductor element such as a MOSFET has temperature characteristics, the threshold voltage may vary depending on an ambient temperature to be used. However, the oscillation frequency may be determined only by the resistance value of the resistor R10 and the capacitance of the capacitors C10 and C11 using the oscillator 210 having the circuit as illustrated in FIG. 5, regardless of the temperature characteristics of the semiconductor elements. In addition, for the resistors and the capacitors, the influence of temperature on the oscillation frequency may be reduced using those having relatively low temperature characteristics.

Meanwhile, since the resistors and the capacitors tend to cause manufacturing variations in the absolute values of the resistance value and the capacitance, the oscillation frequency of the output pulse signal may be influenced by manufacturing variations of the resistor R10 and the capacitors C10 and C11. As described above, in the present embodiments, the deviation of the oscillation frequency from the design value is adjusted by the counter value of the counter circuit 240.

(Counter Circuit)

Figure 6:
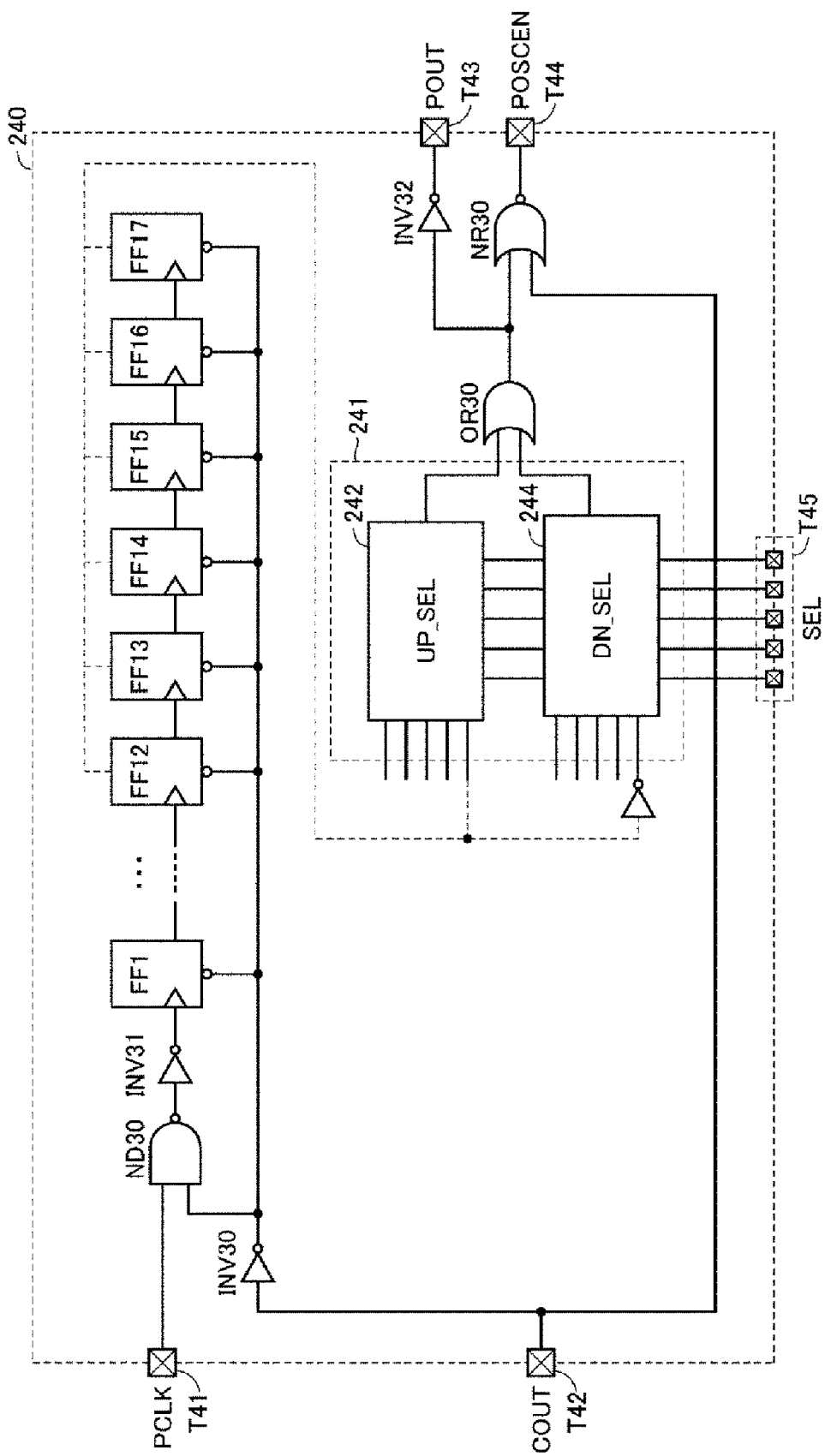
FIG. 6 is a diagram illustrating details of a counter circuit.

FIG. 6 is a diagram illustrating details of the counter circuit 240. Referring to FIG. 6, the counter circuit 240 includes flip-flop circuits FF1 to FF17 connected in series, a multiplexer 241, a NAND circuit ND30, inverters INV30 to INV32, an OR circuit OR 30, and a NOR circuit NR30.

One input of the NAND circuit ND30 is connected to a terminal T41 that receives the pulse signal PCLK from the oscillator 210. The other input of the NAND circuit ND30 is connected to a terminal T42 via the inverter INV30. An output of the NAND circuit ND30 is connected to an input of the flip-flop circuit FF1 via the inverter INV31.

The terminal T42 receives the output signal COUT from the comparator COMP1 in FIG. 3. The output signal COUT received at the terminal T42 and passing through the inverter INV30 is input to the NAND circuit ND30 and is also connected to a preset terminal of each of the flip-flop circuits FF1 to FF17.

When the voltage of the power supply voltage VDD becomes higher than the reference voltage VREF and the signal COUT becomes "L" (i.e., the output of the inverter INV30 becomes "H"), the NAND circuit ND30 transfers the pulse signal PCLK from the oscillator 210 to the flip-flop circuit FF1. Further, when the output of the inverter INV30 becomes "H," the flip-flop circuits FF1 to FF17 are initialized and the pulse signal PCLK from the oscillator 210 starts to be counted.

Each of the flip-flop circuits FF1 to FF17 inverts the output signal each time one pulse signal is input. In the counter circuit 240 of FIG. 6, since the 17 flip-flop circuits FF1 to FF17 are connected in series, it is possible to count $2^{17}$ pulse signals as a whole.

Output signals of the flip-flop circuits FF1 to FF17 are output to the multiplexer 241. Further, in FIG. 6, an example of the case where only the outputs of the flip-flop circuits FF12 to FF17 are output to the multiplexer 241 is illustrated. In addition, the number of stages of the flip-flops and a stage of the flip-flops that output to the multiplexer 241 are set according to the number of pulses to be counted.

The multiplexer 241 includes a rise selection part (UP_SEL) 242 configured to detect a rise of the signal output from each of the flip-flop circuits, and a fall selection part (DN_SEL) 244 configured to detect a fall thereof. The rise selection part 242 and the fall selection part 244 are connected to the terminal T45 and receive the selection signal SEL output from the trimming circuit 260. When the rise selection part 242 and the fall selection part 244 detect a change in the signal from the flip-flop circuit corresponding to the selection signal SEL, they output signals to the OR circuit OR30. That is, the multiplexer 241 outputs signals to the OR circuit OR30 when the count value of the pulse signal PCLK becomes a predetermined value corresponding to the selection signal SEL.

An output of the OR circuit OR30 is connected to a terminal T43 via the inverter INV32. The output signal POUT is output from the terminal T43 and transferred to the signal output part 300 in FIG. 3. The output signal POUT is set to "H" until the number of pulses output from the oscillator reaches a predetermined value, and is set to "L" when the number of pulses reaches the predetermined value. That is, the output signal POUT corresponds to a count completion signal in the counter circuit 240.

Further, the output of the OR circuit OR30 is connected to one input of the NOR circuit NR30. The other input of the NOR circuit NR30 is connected to the terminal T42 and receives the output signal COUT of the comparator COMP1. An output of the NOR circuit NR30 is connected to a terminal T44 and is output as the enable signal POSCEN to the oscillator 210 and the trimming circuit 260.

That is, the enable signal POSCEN is a signal which becomes "H" when the power supply voltage VDD exceeds the reference voltage VREF and the count in the counter circuit 240 is not completed, and which becomes "L" in other cases.

(Trimming Circuit)

FIG. 7 is a diagram illustrating details of the trimming circuit 260. Referring to FIG. 7, the trimming circuit 260 includes a plurality of switching parts (TRM1, TRM2, TRM3, etc.). Further, in FIG. 7, for ease of description, details of a circuit of only the switching part TRM1 among the plurality of switching parts are described. The other switching parts TRM2, TRM3, etc. also have the same circuit configuration.

The switching part TRM1 includes switches MP20 and MP21 which are P-type MOSFETs, a switch MN20 which is an N-type MOSFET, inverters INV20 to INV22, a resistor R20, and a fuse F20.

The switches MP20 and MP21 and the fuse F20 are connected in series between a terminal T31 that receives the power supply voltage VDD and a terminal T34 that receives the reference potential GND. A source of the switch MP20 is connected to the terminal T31, and a drain of the switch MP20 is connected to a source of the switch MP21. A drain of the switch MP21 is connected to the terminal T34 via the fuse F20. The switch MN20 is connected in parallel to the fuse F20.

A gate of the switch MP20 is connected to a terminal T32 and receives the signal PGATE output from the oscillator 210. Gates of the switch MP21 and the switch MN20 are connected to a terminal T33 via the inverter INV22. The terminal T33 receives the enable signal POSCEN output from the counter circuit 240.

The drain of the switch MP21 is connected to a terminal T35 via the resistor R20 and the inverters INV20 and INV21. The selection signal SEL is output from the terminal T35 to the counter circuit 240.

The fuse F20 is a trimming element having a cuttable conductive part. The conductive part may be cut using, for example, a laser cutter or the like.

When the enable signal POSCEN is in the initial state of "L" (i.e., the power supply voltage VDD is less than the reference voltage VREF), since the switch MP21 becomes non-conductive and the switch MN20 becomes conductive, the selection signal SEL becomes "L."

When the power supply voltage VDD is greater than or equal to the reference voltage VREF and the enable signal POSCEN becomes "H," the switch MP21 becomes conductive and the switch MN20 becomes non-conductive. Further, as described above with reference to FIG. 5, when the enable signal POSCEN becomes "H" and the oscillator 210 is started up, the potential of the signal PGATE in the oscillator 210 is lowered, and in response to this, the switch MP20 becomes conductive. Thus, the power supply voltage VDD is supplied to the circuit.

At this time, when the fuse F20 is not cut, since the drain of the switch MP21 is connected to the reference potential GND, the selection signal SEL remains "L." On the other hand, when the fuse F20 is cut, since the power supply voltage VDD is applied to the drain of the switch MP21, the selection signal SEL becomes "H." By cutting the fuse F20 in this manner, the desired selection signal can be set to "H." Therefore, by setting the predetermined value of the count value of the multiplexer 241 in the counter circuit 240 to correspond to each switching part, it is possible to set a desired count value according to the fuse F20 to be cut.

FIG. 8 is a diagram summarizing a state of each element in the switching part TRM and a state of the selection signal SEL to be output, as described above. As can be seen from FIG. 8, when the fuse F20 is cut, the selection signal SEL becomes "H" when the enable signal POSCEN becomes "H," and becomes "L" in other cases.

Further, the expression that the signal PGATE is in an "Active" state may indicate a state where the potential is not lowered to the state of "L" (reference potential GND) but is lowered to the extent that the P-type MOSFET becomes conductive.

In the trimming circuit 260 of FIG. 7, the power supply voltage VDD is applied to the circuit only while the enable signal POSCEN is "H" (i.e., while the counting process is being performed in the counter circuit 240). Therefore, it is possible to prevent unnecessary power consumption in the trimming circuit 260 after the target device 10 is started up.

(Description of Operation of Power Supply-Monitoring Circuit)

Figure 9:
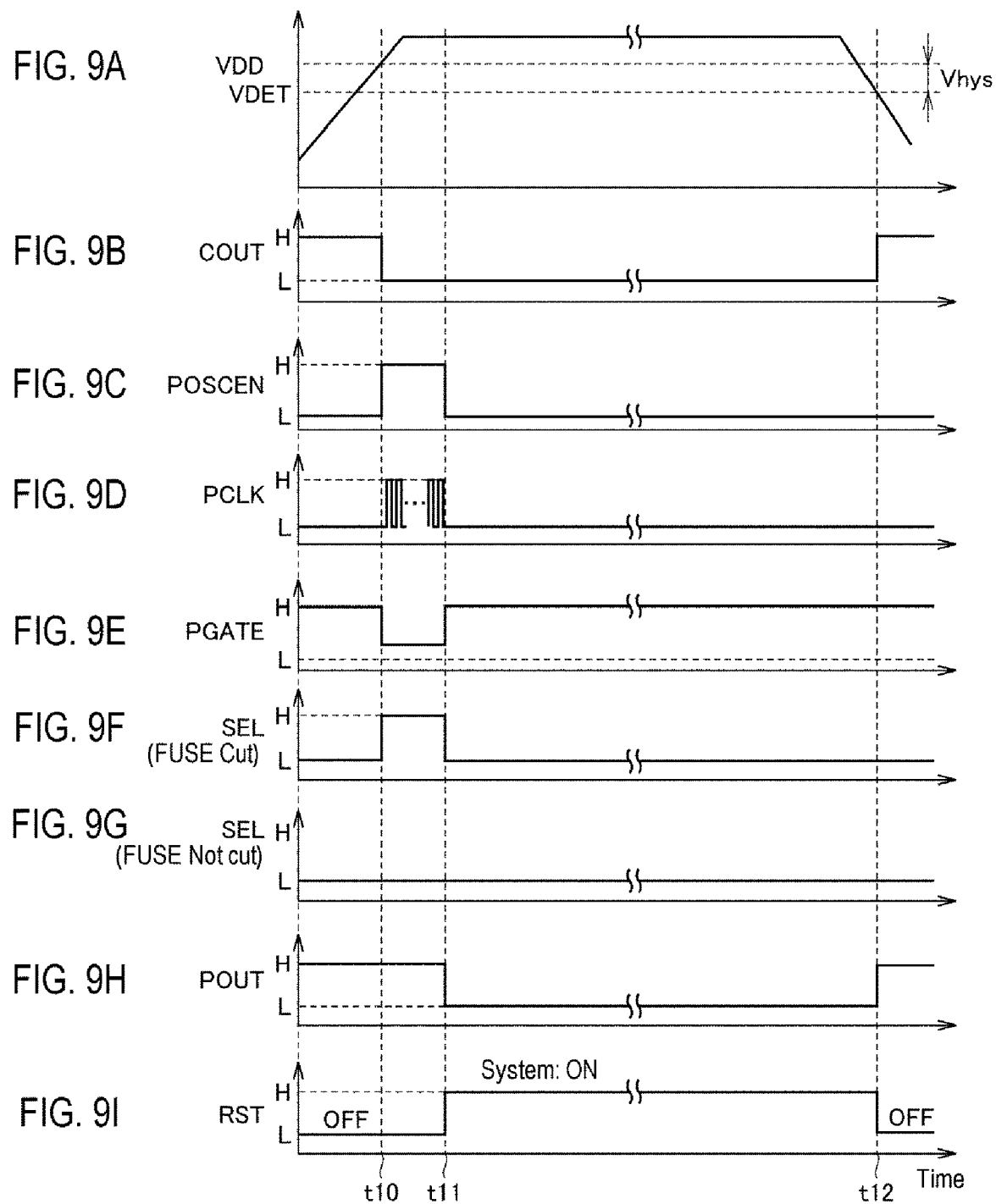
FIGS. 9A and 9I are timing charts illustrating an operation of the power supply-monitoring circuit.

FIGS. 9A to 9I are timing charts illustrating an operation of the power supply-monitoring circuit 20 according to the present embodiments. In FIGS. 9A to 9I, from the top, FIG. 9A illustrates the power supply voltage VDD, FIG. 9B illustrates the output signal COUT of the comparator COMP1, FIG. 9C illustrates the enable signal POSCEN of the counter circuit 240, FIG. 9D illustrates the pulse signal PCLK of the oscillator 210, FIG. 9E illustrates the signal PGATE of the oscillator 210, FIG. 9F illustrates the selection signal SEL when the fuse of the trimming circuit 260 is cut, FIG. 9G illustrates the selection signal SEL when the fuse of the trimming circuit 260 is not cut, FIG. 9H illustrates the output signal POUT of the timer circuit 200, and FIG. 9I illustrates the reset signal RST of the signal output part 300.

Referring to FIGS. 9A to 9I, in the initial state before the power supply of the electronic device 1 is supplied, the signal COUT, the signal PGATE, and the signal POUT are in an "H" state and the other signals are in an "L" state.

When the power supply is supplied and the power supply voltage VDD rises to the voltage of the lower limit voltage VDET plus the hysteresis voltage Vhys of the operable voltage range of the target device 10 (time t10), the output signal COUT of the comparator COMP1 becomes "L." With this signal COUT as a trigger, the enable signal POSCEN becomes "H" and in response to this, the oscillator 210 is started up and the pulse signal PCLK starts to be oscillated. At this time, the signal PGATE of the oscillator 210 is lowered to a potential such that the switches MP10 to MP15 become conductive.

When the enable signal POSCEN becomes "H" and the potential of the signal PGATE is lowered, the power supply voltage VDD is supplied to the trimming circuit 260. In the trimming circuit 260, only the selection signal SEL from the switching part where the fuse F20 is cut becomes "H," and the selection signal SEL from the switching part where the fuse F20 is not cut remains "L." Thus, in the counter circuit 240, a predetermined value of the count value is set depending on the selection signal SEL.

Then, in the counter circuit 240, when the count value of the pulse signal PCLK from the oscillator 210 reaches the predetermined value (time T11), the output signal POUT becomes "L" and the reset signal RST to the target device 10 becomes "H." Thus, the system of the target device 10 is started up.

Further, in the counter circuit 240, when the count value of the pulse signal PCLK reaches the predetermined value, the enable signal POSCEN becomes "L" and in response to this, the oscillator 210 is stopped and the power supply to the trimming circuit 260 is also stopped.

Thereafter, when the power supply of the electronic device 1 is cut and the power supply voltage VDD is lower than the lower limit value VDET (time t12), the output signal COUT of the comparator COMP1 becomes "H" and the output signal POUT of the counter circuit 240 becomes "H." Thus, the reset signal RST to the target device 10 becomes "L," and the target device 10 is stopped.

By configuring the timer circuit 200 in the power supply-monitoring circuit 20 as described above, it is possible to eliminate the influence of temperature characteristics of the semiconductor element at the oscillation frequency of the oscillator 210. Further, by adjusting the count value of the counter circuit 240 with the trimming circuit 260, it is possible to compensate for the deviation of the oscillation frequency caused by manufacturing variations. Thus, it is possible to improve the measurement accuracy of the timer circuit 200 for a wide temperature range.

[Example of Arrangement in IC Package]

Figure 10:
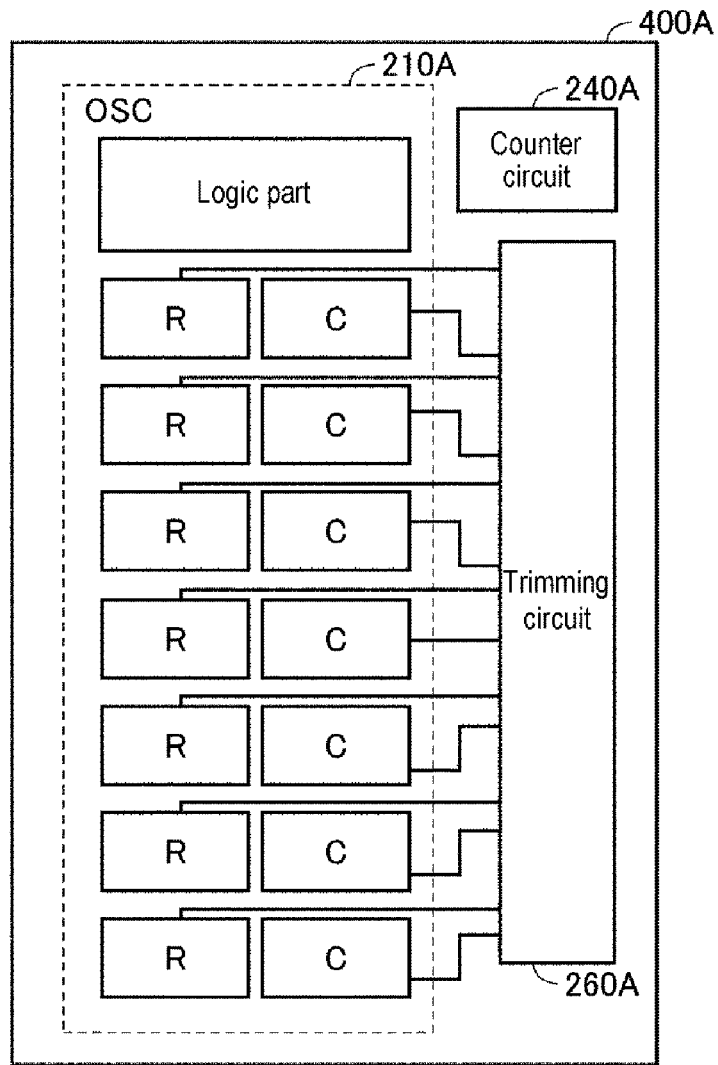
FIG. 10 is an example of an arrangement of the timer circuit according to the comparative example in an IC package.
Figure 11:
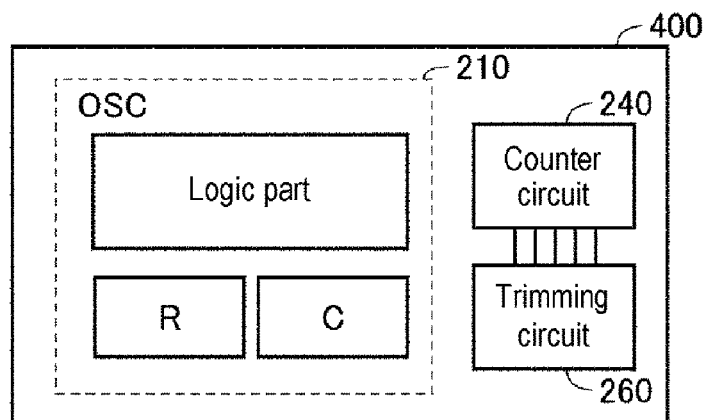
FIG. 11 is an example of an arrangement of the timer circuit according to embodiments of the present disclosure in an IC package.

Here, in the timer circuit 200A according to the comparative example illustrated in FIG. 4 and the timer circuit 200 according to the present embodiments, examples of arrangements in an IC package when each timer circuit is integrated are compared with reference to FIGS. 10 and 11. FIG. 10 is an example of an arrangement in an IC package 400A of the timer circuit 200A according to the comparative example, and FIG. 11 is an example of an arrangement in an IC package 400 of the timer circuit 200 according to the present embodiments.

In the case of the timer circuit 200A according to the comparative example, as described above, it is configured in a manner that the deviation of the oscillation frequency due to the temperature characteristics and the manufacturing variations of semiconductors is adjusted by selecting the resistors and the capacitors of the oscillator 210A by the trimming circuit 260A. Therefore, a plurality of resistors and capacitors for adjustment are arranged in the IC package 400A, and a wide area is used for these resistors and capacitors (FIG. 10).

On the other hand, in the case of the timer circuit 200 according to the present embodiments, since only one set of resistor and capacitor for determining the oscillation frequency are arranged in the oscillator 210, the area required for the oscillator 210 is reduced. Further, regarding the deviation caused by the manufacturing variations of the oscillation frequency output from the oscillator 210, the number of counters in the counter circuit 240 is selected by the trimming circuit 260, but since the setting of the number of counters is executed by the logic part of the counter circuit 240, it is not necessary to newly arrange the elements such as resistors and capacitors as in the comparative example. Thus, it is possible to greatly reduce the area of the IC package and miniaturize the size thereof by using the timer circuit 200 according to the present embodiments.

Figure 12:
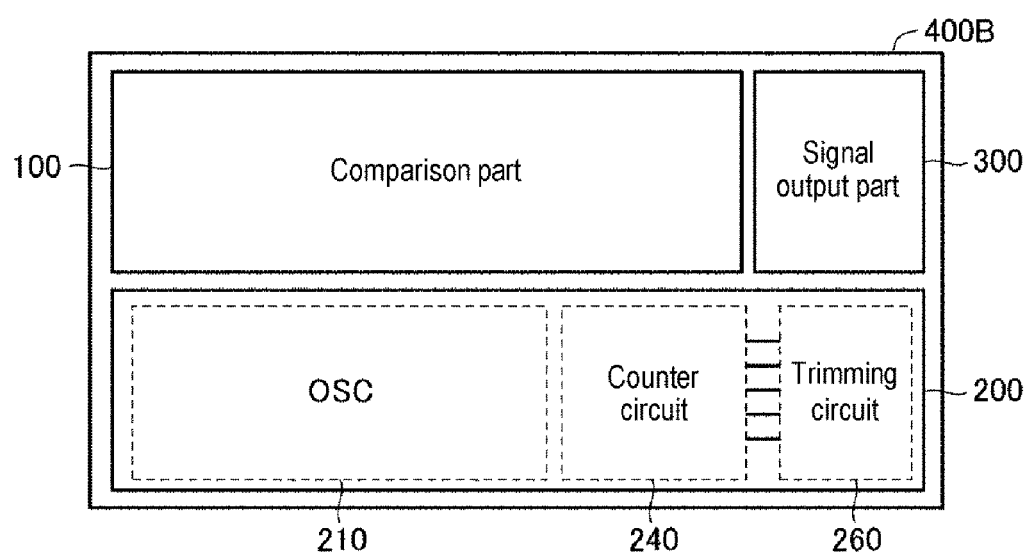
FIG. 12 is an example of an arrangement of a power supply-monitoring circuit 20 in an IC package.

In addition, FIG. 12 illustrates an example of an arrangement in an IC package 400B when the power supply-monitoring circuit 20 is integrated. In FIG. 12, the signal output part 300 is arranged adjacent to the comparison part 100, and the timer circuit 200 is arranged so as to be adjacent to both the comparison part 100 and the signal output part 300. In the timer circuit 200, the counter circuit 240 is disposed between the oscillator 210 and the trimming circuit 260. In other words, the counter circuit 240 is arranged adjacent to the oscillator 210, and the trimming circuit 260 is arranged adjacent to the counter circuit 240.

[Simulation Results]

Figure 13:
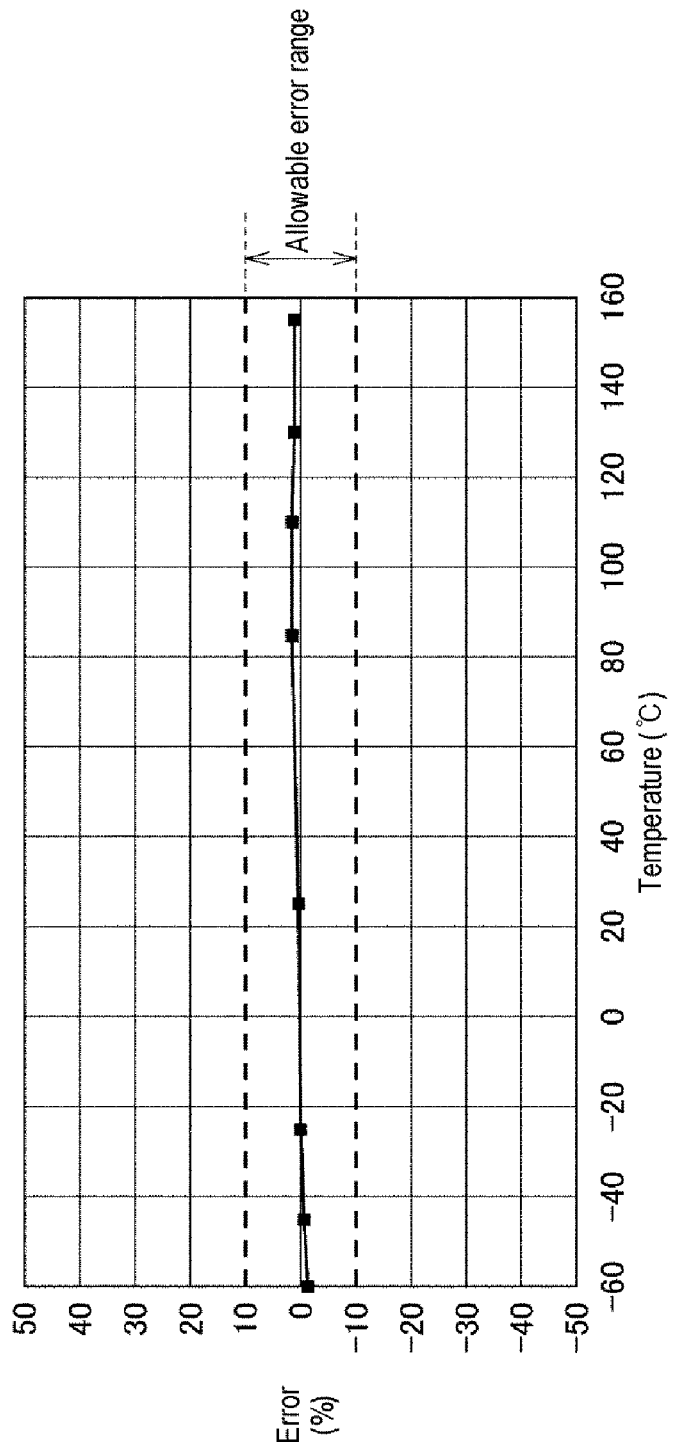
FIG. 13 is a diagram illustrating a result of simulating measurement errors for temperature variations for the timer circuit according to embodiments of the present disclosure.

FIG. 13 illustrates a result of simulating measurement errors for different temperatures to be used for the timer circuit 200 according to the present embodiments. As can be seen from FIG. 13, it is possible to realize accuracy within ±10% of an allowable error range even under an environment of −60 to 160 degrees C.

As described above, in the timer circuit according to the present embodiments, it is possible to improve measurement accuracy of time by compensating for the temperature characteristics and manufacturing variations of the elements while preventing an increase in the circuit area.

According to the present disclosure in some embodiments, in a trimming circuit of an electronic circuit according to the present disclosure, a conductive part of a trimming element corresponding to an oscillation frequency of a pulse signal output from an oscillator is cut, and a predetermined value of a count value is set in a counter circuit depending on a selection signal output corresponding to the trimming element. Therefore, even when the oscillation frequency of the pulse signal from the oscillator deviates from a design value due to temperature or manufacturing variations, a desired time can be measured by adjusting the predetermined value of the count value in the counter circuit using the trimming circuit. Thus, it is possible to improve measurement accuracy of the electronic circuit. In addition, since it is not necessary to install a large number of capacitors and resistors for adjustment on the oscillator side, it is possible to prevent an increase in the circuit area.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An electronic circuit configured to output an output signal after elapse of a predetermined time from a received signal, the electronic circuit comprising:
   an oscillator configured to output a pulse signal;
   a counter circuit configured to count the pulse signal from the oscillator and to output the output signal; and
   a trimming circuit including a plurality of trimming elements which includes a plurality of cuttable conductive parts and configured to output a selection signal corresponding to a trimming element having a cut conductive part,
   wherein the counter circuit is configured to set a count value according to the selection signal.

2. The electronic circuit of claim 1, wherein the counter circuit is arranged adjacent to the oscillator, and
   wherein the trimming circuit is arranged adjacent to the counter circuit.

3. The electronic circuit of claim 2, wherein the counter circuit is arranged between the oscillator and the trimming circuit.

4. The electronic circuit of claim 1, wherein the trimming circuit is arranged at a corner portion of the electronic circuit and arranged adjacent to a signal output part that is configured to output the output signal.

5. The electronic circuit of claim 4, wherein the counter circuit, the oscillator, and the trimming circuit are arranged on a first line, and
   wherein the signal output part is arranged on a second line that is different from the first line and an extended line of the first line.

6. The electronic circuit of claim 1, wherein a comparison part is arranged outside the electronic circuit.

7. The electronic circuit of claim 4, wherein a comparison part is arranged outside the electronic circuit, and
   wherein the signal output part is arranged adjacent to the comparison part.

8. The electronic circuit of claim 4, wherein a comparison part is arranged outside the electronic circuit, and
   wherein the electronic circuit is arranged between the comparison part and the signal output part.

9. The electronic circuit of claim 1, the trimming circuit is connected to the counter circuit.

10. The electronic circuit of claim 1, wherein the oscillator is configured to start outputting the pulse signal in response to the received signal and to stop outputting the pulse signal according to an output of the output signal from the counter circuit.

11. The electronic circuit of claim 1, wherein the trimming circuit is configured to output the selection signal only while the pulse signal is output from the oscillator.

12. The electronic circuit of claim 11, wherein the trimming circuit includes a plurality of switching parts corresponding to the plurality of trimming elements, respectively,
   wherein each of the plurality of switching parts includes:
      a first switch including a first end connected to a power supply voltage and a second end connected to a reference potential via a corresponding trimming element;
      a second switch connected in parallel to the corresponding trimming element; and
      an output terminal connected between the first switch and the second switch and configured to output the selection signal, wherein the first switch becomes conductive during oscillation of the oscillator, wherein the second switch becomes non-conductive in response to receiving the received signal, and wherein the selection signal is output from a switching part including the trimming element, which has the cut conductive part, among the plurality of switching parts.

13. The electronic circuit of claim 1, wherein the counter circuit includes:

a plurality of flip-flop circuits connected in series and configured to count the pulse signal from the oscillator; and a selection part configured to set a predetermined value corresponding to the selection signal and to output the output signal in response to an output corresponding to the predetermined value, among outputs of the plurality of flip-flop circuits.

14. The electronic circuit of claim 13, wherein the counter circuit is configured to start operation of the plurality of flip-flop circuits in response to the received signal.

15. A monitoring circuit for monitoring a power supply voltage supplied to a target device, comprising:

the electronic circuit of claim 1;

a comparison part configured to output the received signal in response to the power supply voltage exceeding a predetermined reference voltage; and a signal output part configured to output a start-up permission signal to the target device in response to the output signal from the electronic circuit.

16. A semiconductor integrated circuit in which the electronic circuit of claim 1 is integrated.

* * * * *